United States Patent [19]

Sweet

[11] Patent Number: 4,924,340

[45] Date of Patent: May 8, 1990

[54] CIRCUIT PROTECTION DEVICE

[75] Inventor: Martin Sweet, Swindon, England

[73] Assignee: Raychem Limited, England

[21] Appl. No.: 239,070

[22] Filed: Aug. 31, 1988

Related U.S. Application Data

[63] Continuation of Ser. No. 99,931, Sep. 23, 1987, abandoned.

[30] Foreign Application Priority Data

Sep. 26, 1986 [GB] United Kingdom ................. 8623176

[51] Int. Cl.$^5$ .............................................. H02H 9/04
[52] U.S. Cl. ....................................... 361/56; 361/58;
361/91; 361/111; 252/62.35
[58] Field of Search .................. 361/54, 56, 58, 91,
361/88, 100, 111, 90; 307/258; 252/62.3 V,
62.35, 518

[56] References Cited

U.S. PATENT DOCUMENTS

| | | | |
|---|---|---|---|
| 3,271,591 | 9/1966 | Ovshinsky | 307/258 |
| 3,343,034 | 9/1967 | Ovshinsky | 317/11 |
| 3,343,085 | 9/1967 | Ovshinsky | 324/110 |
| 3,436,601 | 4/1969 | Dyre | 317/61.5 |
| 3,530,441 | 9/1970 | Ovshinsky | 340/173 |
| 3,558,830 | 1/1971 | Bender | 179/81 |
| 3,852,517 | 12/1974 | Del Fava | 174/84 R |
| 3,983,076 | 9/1976 | Rockstad et al. | 252/518 |
| 3,993,394 | 11/1976 | Cooper | 339/136 |
| 4,015,282 | 3/1977 | Shaw | 357/2 |
| 4,433,342 | 2/1984 | Patel | 357/2 |

FOREIGN PATENT DOCUMENTS

| | | |
|---|---|---|
| 198624A | 10/1986 | European Pat. Off. . |
| 1437387 | 11/1968 | Fed. Rep. of Germany . |
| 1490986 | 11/1977 | United Kingdom . |

OTHER PUBLICATIONS

H. R. Phillip and L. M. Levinson, J. Appl. Phys., 52(2), Feb. 1981, pp. 1083 to 1090.
D. Adler, M. S. Shur, M. Silver and S. R. Ovshinsky, J. Appl. Phys., 51(6), Jun. 1980, pp. 3289 to 3309.
Peterson and D. Adler, J. Appl. Phys., 47, 1976, pp. 256 ff.
R. C. Callarotti and P. E. Schmidt, Thin Solid Films, 90, (1982), pp. 379–384.
Physics of Disordered Materials, Ed., D. Adler, H. Fritzsche and S. Ovshinsky, Plenum Press, 1985, pp. 779 to 809.
R. Pinto & K. V. Remanathan, App. Phys. Lett., 19 (7), 1971.

*Primary Examiner*—Todd E. Deboer
*Attorney, Agent, or Firm*—Bernard J. Lyons; Herbert G. Burkard

[57] ABSTRACT

A circuit protection device for protecting an electrical circuit from a voltage transient, e.g. a voltage transient caused by an electrostatic discharge, lightning or a nuclear electromagnetic pulse, comprises a threshold switching element formed from an amorphous composition comprising arsenic, sulphur, and optionally germanium, and a pair of electrodes in contact with the composition. The devices generally exhibit a good balance of physical properties including switching speed, energy required to latch them in their low resistance state, high resistance state (off) resistance, threshold voltage and capacitance, which enables them to be used successfully to protect electrical circuits from such transients.

7 Claims, 3 Drawing Sheets

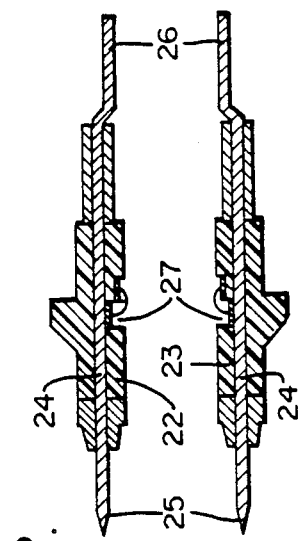
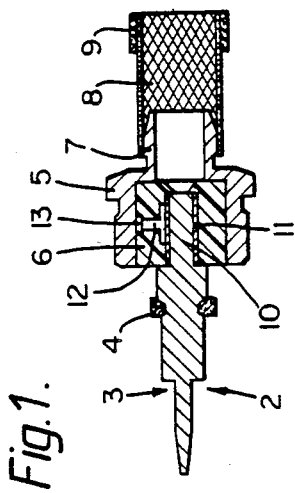
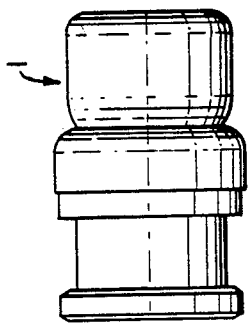
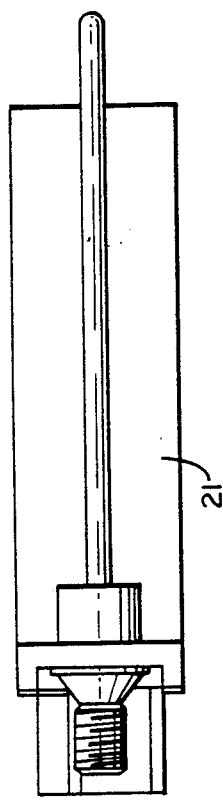

CIRCUIT PROTECTION DEVICE

This application is a continuation of application Ser. No. 099,931, filed Sept. 23, 1987 now abandoned.

This invention relates to circuit protection devices, and especially to devices for protecting electrical circuits against voltage transients that are caused by an electromagnetic pulse.

Electromagnetic pulses can induce very high currents and voltages on cables and structures such as aeroplanes and ships, which can penetrate the electrical systems and damage them, either causing hardware damage such as semiconductor burnout, or electronic upset, e.g. transmission loss or loss of stored data. As semiconductor technology advances, the energy needed to cause such damage becomes less.

Electrostatic discharges are extremely fast discharges from a capacitor such as a human body. These discharges, because they can be so local, present an extreme threat to the individual electronic component. The magnitude of the threat is illustrated by reference to IEC Technical Committee TC65, WG4 draft specification or the SAE-AE-4 proposed specification on ESD. In these documents the maximum threat is a double exponential pulse of rise time 5 nanoseconds with a 30 nanosecond fall time. The peak voltage is given as 15,000 volts with a current of 70 amps. The energy storage capacitance is given as 150 pico farads giving a maximum energy of 33 millijoules.

Induced electrical transients caused by lightning represent a threat to electrical/electronic equipment especially in aerospace vehicles. The characteristics of the induced pulses are best described in the SAE AE4L Committee Report AE4L-81-22. Test Wave Forms and Techniques for Assessing the Effects of Lightning -Induced Transients. This specification describes the idealised versions of the lightning stroke waveform and of those which occur when equipment cables are excited by the EM environment produced. The specification specified a range of transients which may be produced during normal operation. The waveforms expected on each line depends on a number of factors but the two basic types are (waveform 3) with a frequency of between 1 and 10 MHz, a rise time of 45 nanoseconds and a peak current of 24 amps. The alternative wave form (Wave Form 4A) is a decaying exponential with a rise time of 100 nanoseconds and a width of 2 microseconds with a peak voltage of 300 volts and peak current of 60 amps.

The most severe threat to electrical and electronic equipment is the electromagnetic pulse due to detonation of a nuclear device which can generate large voltage or current spikes with very short rise times. The exact characteristics of the pulse are complicated although a typical pulse will exhibit a field strength of about $10^5$ Vm$^{-1}$ with an accompanying H field intensity of 270 Am$^{-1}$ (based on free space impedance of 377 ohms), a pulse width of a few microseconds and a rise time of a few nanoseconds. In general damaging amplitudes in the pulse occur within the frequency range of 10 KHz to 100 MHz.

In many circumstances it may be necessary to protect equipment from voltage transients other than those due to nuclear detonation. For example, although lightning is not normally associated with transients having such short rise times, it has recently been considered that certain components in lightning transients may, in fact, exhibit very short rise times and so may not be removed by conventional surge arrestors.

In order to protect electrical circuits from such threats it would be desirable to incorporate therein a circuit protection device which, in normal operation, has a high resistance but which, when the circuit is subjected to a voltage surge, quickly changes to a low resistance state in order to short the current surge to earth, and, after the current surge has finished, immediately reverts to its high resistance state. Based on the electrical characteristics of the pulse and the nature of the equipment it is intended to protect, it is possible to determine what characteristics of a circuit protection device are necessary for it to be able successfully to protect the circuit against the pulse damage. For example, one set of guidelines published by H. R. Philipp and L. M. Levinson in J. Appl Phys 52(2) February 1981 pp. 1083 to 1090, the disclosure of which is incorporated herein by reference, specifies inter alia the following requirements for a surge arrestor material that is intended to short a voltage transient to earth:

| | |
|---|---|
| Threshold voltage | 100 V |
| Switching delay time | <1 nanosecond |
| Current capacity | up to 400 A |
| Insertion loss | <0.4 dB at 0 to 200 MHz |
| | <0.8 dB at 200 to 500 MHz |
| Size limit | 1 cm |

In addition to these requirements, the device will need a resistance in normal operation of at least about $10^6$ ohms in order to allow the equipment to function correctly.

The insertion loss, or attenuation of an electrical signal, at any frequency may be determined from the capacitance of the device, and it is this value of attenuation which is required to determine the suitability of any protection device. Since the switching device will comprise a normally insulating switching element located between a pair of conductive electrodes, the capacitance of the device (assuming parallel plate configuration) is given by $$C = \epsilon_0 \epsilon_r . A . T^{-1}$$

where
C is the capacitance;
$\epsilon_0$ is the absolute permitivity of free space $(8.85 \times 10^{-12} \text{Fm}^{-2}$; $\epsilon_r$ is the relative permitivity of the dielectric;
A is the cross-sectional area (in meters), and t is the thickness of the dielectric (in meters);
and the insertion loss, measured in decibels, is given by:

$$\text{Insertion loss} = 20.\log_{10}[V_1/V_2]$$

where
$V_1/V_2$ is the ratio of the signal intensity without the device to that with the device, and is given by:

$$V_1/V_2 = [1 + (2\pi f C R)2]^{\frac{1}{2}}$$

where
f is the frequency of the signal (in Hertz); and
R is the characteristic impedance.

One class of material that has been proposed for use in the manufacture of circuit protection devices in general are the chalcogenide glasses, by which is meant glasses formed from elements of group VIB of the periodic table (IUPAC 1965 revision) together with other elements, especially those of groups IVB and VB, for example as described in U.S. Pat. No. 3,271,591 to Ovshinsky. Certain of these glasses can be used to form "threshold" devices by which is meant devices that will change from a high resistance state to a low resistance state on application of a high voltage but which will remain in their low resistance state only for as long as a small "holding" current is maintained. Other chalcogenide glasses can be used to form "memory" devices which will change from a high resistance state to a low resistance state on application of a high voltage and which will remain in the low resistance state, even when no voltage is applied, until an appropriate, different, voltage pulse is applied. As will be appreciated, only threshold devices are appropriate for the production of circuit protection devices.

The chalcogenide glass materials have the advantage that they exhibit very short switching times between their high and low resistance states when the voltage transient that causes switching is significantly higher (e.g. about 50 V or more) than the threshold voltage, typically less than 1 nanosecond, which is sufficiently fast for protecting circuits from the transient. However, they suffer from a number of disadvantages that, hitherto, have prevented their use for such purposes For example they have generally exhibited too high a threshold switching field strength, e.g. in the order of $4 \times 10^5$ Vcm$^{-1}$, with the result that in order for a switch using such a material to exhibit an acceptable switching voltage e.g. 100 V the switching element has to be so thin that the switch exhibits unacceptably high capacitance and too low a resistance in the normal operation, high resistance mode.

According to one aspect, the invention provides a circuit protection device for protecting an electrical circuit from a voltage transient, which comprises a threshold switching element formed from an amorphous composition comprising arsenic and sulphur and optionally including germanium and a pair of electrodes in contact with the composition.

We have found that it is possible to form threshold switches from such chalcogenide glasses that have a balance of properties that enable them to be used successfully for protecting equipment from voltage transients. For example, we have found that the threshold field strength of these glasses are, in general, lower than $4 \times 10^5$ Vcm$^{-1}$ and can be in the order of $1 \times 10^5$ Vcm$^{-1}$. Furthermore the off resistivity of the glasses can be in the order of $10^8$ ohm cm as compared with $10^7$ ohm cm for the previously proposed glasses. Thus it is possible to form circuit protection devices that are acceptable by appropriate choice of the glass optionally together with dimensional control of the device, for example by increasing the thickness of the chalcogenide glass switching element e.g to 5 to 20 micrometers and especially about 10 micrometers.

The threshold field strength of the element combined with the other properties thereof causes the threshold voltage of the device to remain at an acceptable value e.g. from 70 to 200 V, while the increased off resistivity of the element enables an acceptable normal resistance value of about $10^6$ ohms to be achieved.

Another disadvantage of the previously proposed materials is that they generally exhibited a relatively low energy to latch, so that, although such devices will often revert to their high resistance state as soon as the transient voltage has subsided, it is easily possible for a device to be forced permanently into its low resistance state if the energy of the transient is large or if a number of rapid transients are experienced. In fact, the energy needed to "latch" the previously proposed devices permanently into their conductive state is often less than the expected energy of the transient against which the device is intended to provide protection. Thus, although the electrical and electronic equipment would be protected against the transient, the equipment would not then operate until the protection device is replaced or reset. In contrast, the materials used in the devices according to the present invention exhibit a relatively high energy to latch and often considerably higher than that exhibited by any of the previously proposed materials. The "energy to latch" or "latching energy" is defined herein as the electrical energy required to force the switching element or the glass composition permanently into its low resistance state. Some values for the energy to latch are quoted herein in units of energy (mJ), and such values refer to glass compositions of 10 micrometer thickness and 1 mm$^2$ area. It is believed that the energy to latch is substantially proportional to the thickness of the glass, at least at thicknesses of this order of magnitude, and independent of the area, at least for areas of this order of magnitude, and so other values herein may be quoted in units of energy per thickness of the glass. Preferably the materials have an energy to latch of at least 4000, more preferably at least 5000 and especially at least 10,000 Jm$^{-1}$ (or, more correctly, microjoules micrometer$^{-1}$) which corresponds to at least 40, more preferably at least 50 and especially at least 100 mJ for a 1 mm$^2$ 10 micrometer thick device. The energy to latch should be determined using electrical energy of 1 MHz frequency.

A useful property for comparing the utility of different threshold switching devices is the "figure of merit" of the device which may be defined as follows:

$$\text{Figure of merit} = \frac{E_L' \cdot R}{V' \cdot C}$$

where $E_L'$ is the energy to latch of the switching element (measured in joules);

R is the high resistance state resistance of the switching element (measured in ohms);

V' is the threshold voltage of the switching element (measured in volts); and

C is the capacitance of the switching element (measured in farads).

The device preferably has a figure of merit of at least $1 \times 10^{14}$, more preferably at least $5 \times 10^{14}$ and especially at least $1 \times 10^{15}$ JA$^{-1}$F$^{-1}$.

There is essentially no lower limit on the content of arsenic in the compositions used in the present invention provided that any such composition falls within the glass forming region of the germanium/arsenic/sulphur system and it is possible in some cases that no arsenic at all be present so that the glass is based on a germanium/sulphur binary system. Preferably, however, some arsenic is present even if it is present only in a very small quantity e.g. 0.1% or more, preferably 1% or more (by mole).

Preferably the glass material comprises:
(a) up to 42 atomic percent germanium;
(b) up to 65 atomic percent arsenic; and (c) from 15 to 90 atomic percent sulphur.

The glass material more preferably contains at least 3 atomic percent germanium but especially not more than 30 atomic percent germanium, at least 10 atomic percent arsenic but preferably not more than 50 atomic percent arsenic, and/or at least 30 atomic percent sulphur, most preferably at least 40 atomic percent sulphur but preferably not more than 80 atomic percent sulphur and especially not more than 70 atomic percent sulphur.

All the proportions of the components germanium, arsenic and sulphur are based on the total molar quantity of germanium, arsenic and sulphur alone and total 100%.

It is possible for quantities e.g. up to 10% or sometimes more, of other materials to be present in the compositions used in the devices according to the invention, for example minor amounts of the elements selenium, phosphorus, bismuth, silicon, tin, lead, halogens and some transition metals provided that the presence of such materials does not deleteriously affect the properties, such as the energy to latch and/or off resistivity, to a significant degree.

The compositions used in devices of the invention may contain not more than 10 atomic percents tellurium (based on the total molar quantity of the composition).

The switching element is usually formed by a vapour deposition method in which a vapour of the appropriate composition is deposited onto one of the electrodes. The vapour may be generated by heating an appropriate mixture of the components (not necessarily having the same composition as the intended glass) or the separate components may simultaneously be heated. Alternative methods of depositing the glass, for example sputtering such as R.F. magnetron sputtering or co-sputtering may instead be used.

It is believed that one factor in determining the quality of the switch is the contact resistance between the glass material and the electrodes and that a reduction in the contact resistance can increase the energy to latch of the switch. Preferably the electrode contact resistance is sufficiently low that the overall electrode-to-electrode resistance of the device is not more than 10 ohms and especially not more than 5 ohms, the most preferred resistance being less than 1 ohm. Formation of a device having a low electrode contact resistance may be assisted for example by depositing the glass material on the electrode by a vacuum method for example by evaporation. If desired, materials such as indium may be provided as a layer between the electrode and the glass and/or incorporated in at least part of the glass in order to reduce the contact resistance.

The dimensions of the switching element used in the device according to the invention will depend on the particular chalcogenide glass composition that is used to form it, although the thickness of the switching element will usually be not more than 40 micrometers, preferably not more than 20 micrometers, but usually at least 5 micrometers and preferably about 10 micrometers. The cross-sectional area of the switching element, in a plane normal to the direction of current flow therethrough, will depend on the maximum current flow. It is preferably at least 0.5 mm$^2$, the preferred size being about 1 mm$^2$ for discrete devices and for the maximum pulse level, at least 2 mm$^2$.

The devices may be incorporated in an electrical circuit in any suitable position, normally being connected between a current carrying line and earth, (the term "earth" in this context including any structure having an appropriate shape and/or capacity so that it can absorb the charge generated by the transient, and includes for example connection to the chassis and the like in vehicles such as aircraft), and, of course, more than one such device may be employed in the electrical circuit. The devices are conveniently incorporated in other electrical components for example electrical connectors, in which case the device will usually be connected between a current carrying element of the device and a terminal or other part of the device to be earthed e.g. a conductive housing.

Although in most instances the device will revert to its high resistance state as soon as the transient voltage has subsided, it is still possible for the device to be forced into a permanent low resistance state, for example if the voltage transient is unduly large or if a number of rapid transients are experienced. As mentioned above, whether or not the device will become permanently conductive depends on the amount of energy absorbed by the device from the transient. In some applications, for example in some ground installations, it may be desirable for the protection device to fail in this way, that is to say, so that the equipment is still protected against transients but will not function until the protection device is replaced or reset. In other applications it may be desirable for the device to fail in a high resistance (open circuit) state so that the equipment will carry on functioning although unprotected from subsequent transients. Thus in some cases the device may be connected in series to means that will exhibit a high resistance to the intended electrical circuit current at least when the switching element has become permanently conductive. Thus, for example, the switching element may be connected to the current carrying line or to earth via a fuse or switch that is capable of transmitting currents passed through it when the switching element is in its threshold mode but will change to a high resistance state when the switching device has become permanently conductive.

Alternatively or in addition, the device may include a capacitor to ensure that the device exhibits a high resistance to all frequencies below the cut-off limit of the capacitor. Briefly, the use of a capacitor of appropriate size, for example from 10 pF to 2 microfarads in series with the switching element will enable the transient current to be transmitted to earth, since most of the power of the transient current occurs at frequencies above 10 kHz, but will exhibit a high impedance to the intended currents in the circuit which will have significantly lower frequencies or will be a direct current. Also, the use of a capacitor will prevent or significantly reduce the possibility of the switching element latching in its low resistance state after a transient has occurred. Such latching may occur in the absence of a capacitor due to current flow through the switching element keeping the switching element in its low resistance state.

Several embodiments of the invention will now be described by way of example with reference to the accompanying drawings, in which:

FIG. 1 is a side view, partly in section, of a BNC coaxial connector that incorporates a circuit protection device according to the invention;

FIG. 2 is a side view, partly in section, of a flat cable mass termination connector and wafers that incorporate a circuit protection device according to the invention;

Figure 3:
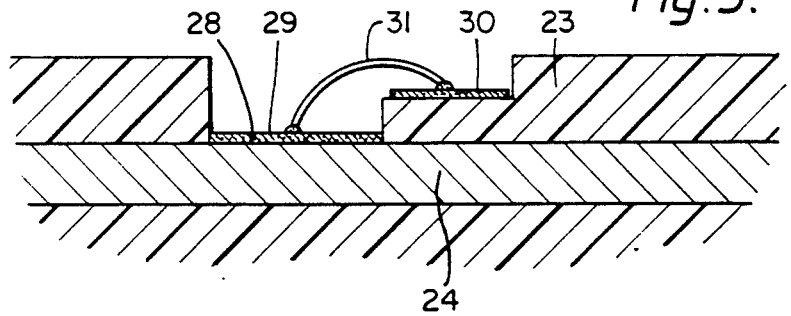
FIG. 3 is an enlarged view of part of the connector shown in FIG. 2.

Referring to FIG. 1 of the accompanying drawings, a connection arrangement for connecting two coaxial cables comprises a connector shell 1 and a male connector 2. The male connector 2 comprises a pin 3, the central and rear portion of which is hollow for receiving the central conductor of a coaxial cable to be connected (not shown). The pin has a fluxed solder ring 4 and a number of apertures (not shown) beneath the solder ring which communicate between the solder ring 4 and the hollow interior of the pin 3. The rear end 10 of the pin is firmly located in a connector housing 5 by means of an electrically insulating plastics spacer 6. The housing 5, which provides the electrical connection between the shields of the cables to be connected, has a termination portion 7 on which is mounted a solder impregnated braid 8 and solder ring 9.

The rear end 10 of the pin is provided on its outer surface with an electrode, e.g. a copper/indium electrode followed by a 10 micrometer thick layer 11 of a sulphur-germanium-arsenic glass described above that has been deposited thereon by a vapour deposition method, and the outer surface of the glass layer 11 has been provided with a further thin (about 5 micrometers thick) electrode, e.g. formed from indium/copper by vapour deposition. The copper electrode is electrically connected to the housing 5 by means of a bonded wire 12.

In order to connect a coaxial cable to the connector, the outer jacket, shield and dielectric are cut back by appropriate amounts and the cable inserted into the connector so that the exposed end of the internal conductor is located within the hollow interior of the pin 3, the dielectric abuts the rear end of the spacer 6 and the exposed shield is located within the solder impregnated braid 8. The connector is then briefly heated, for example by means of a hot-air gun, to fuse the solder rings 4 and 9 and to form solder connections between the pin 3 and central conductor and between the braid 8 and coax cable shield.

The connector will function exactly as a standard coaxial connector until the connected cable experiences a voltage transient whereupon the potential difference across the thickness of the glass layer 11 will cause the glass to become electrically conductive and form a closed circuit between the central conductor and the shield.

Referring to FIGS. 2 and 3, a mass termination connector such as that described in U.S. Pat. No. 3,994,394 (the disclosure of which is incorporated herein by reference) is schematically shown.

The connector comprises a connector housing 21 and a pair of connector wafers 22 and 23 that can be inserted into the housing. Each wafer 22, 23 has a number of (usually 25 or 50) metallic electrical conductors 24 extending therethrough which terminate at one end either in the form of pins 25 or complementary "tuning fork" female contacts and at the other end in the form of contacts 26 for connection to a flat cable or to a number of small single conductor wires. The particular means used for connecting the conductors 24 to the wires or flat cable is not shown but usually comprises one or more solder devices for example as described in U.S. specification Pat. No. 3,852,517.

In each of the wafers 22 and 23 a stepped recess 27 is made that extends across the width of the entire wafer to expose each of the conductors. In one embodiment of this connector, a copper electrode is deposited onto the individual conductors 24 followed by a 10 micrometer thick layer 28 of the sulphur-germanium-arsenic glass described above, and a thin electrode 29 formed e.g. from copper of gold is deposited on top of the glass layer 28. An additional conductive layer 30 or "ground plane" of copper or gold is deposited on the wafer material in the stepped recess 27, the ground plane being electrically earthed for example to the metallic housing of the connector or to an earth pin. Each electrode 29 is connected to the ground plane by means of a wire 31 formed from e.g. gold or aluminum and bonded to the electrode 29 and ground plane 30 by conventional wire bonding techniques.

Alternatively, a single layer 28 of the glass and electrode 29 may be deposited across the entire width of the wafer in which case only a single wire 31 is necessary for connection to the ground plane, or the ground plane and wire can even be dispensed with if one of the conductors 24 is earthed.

In an alternative construction, the glass layer and electrodes are deposited onto the common ground plane 30, and the wires 31 connect the conductors 24, after any appropriate surface preparation if necessary, with the electrode of the glass layer.

Figure 4:
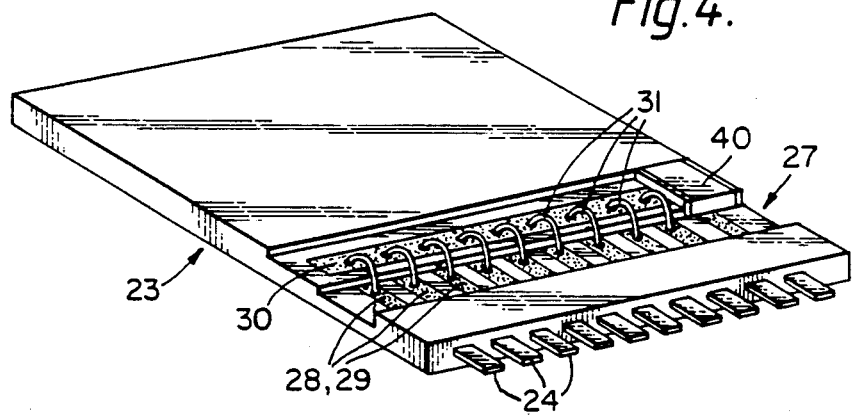
FIG. 4 is a perspective view of a modification of the wafers shown in FIG. 2.

FIG. 4 shows schematically a further modification of the wafer shown in figures 2 and 3. In this form of wafer the glass layers 28 and electrodes 29 are deposited on the conductors 24 as described above and are electrically connected to a ground plane 30 by means of wires 31. In addition, however, a 100 nanofarad capacitor 40 is located in the recess 27 and is connected between the ground plane and an earth terminal or housing of the connector. In this form of device any transient current having a frequency spectrum above about 1 MHz is conducted directly to earth while any direct currents or alternating currents of frequencies significantly lower than about 1 MHz are blocked by the capacitor. This modification of the device has the advantage that it reduces or eliminates the possibility of the glass switching layers 28 being held in their low resistance state by the direct currents in the electrical system after the transient has been transmitted to earth.

Figure 5:
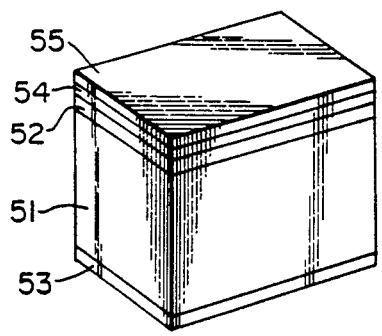
FIG. 5 is a schematic view of a capacitor that incorporates a circuit protection device according to the invention.

FIG. 5 shows schematically a circuit protection device according to the invention that may be incorporated into any larger electrical component. The device comprises a capacitor 51 having a capacitance for example of 0.5 to 3 microfarads (although larger or smaller capacitances e.g. 0.1 to 1 microfarads may be desired in many circumstances) which is provided with terminals 52 and 53. A 10 micrometer thick layer 54 of the sulphur-germanium-arsenic glass switching material described above is deposited on the terminal 52 for example by a vapour deposition method and then a thin copper electrode 55 is deposited on the glass layer 54 by evaporation. Additional metal layers may be provided on top of the electrode 55 in order to improve the formation of solder joints if desired. As described above the glass layer will become conductive when the circuit is exposed to a transient having a high frequency spectrum, e.g. above 1 MHz, to allow the transient to be passed to earth, but the capacitor will exhibit a high impedance to lower frequency signals and therefore prevent such signals latching the glass layer 54 in its low resistance state.

Figure 7:
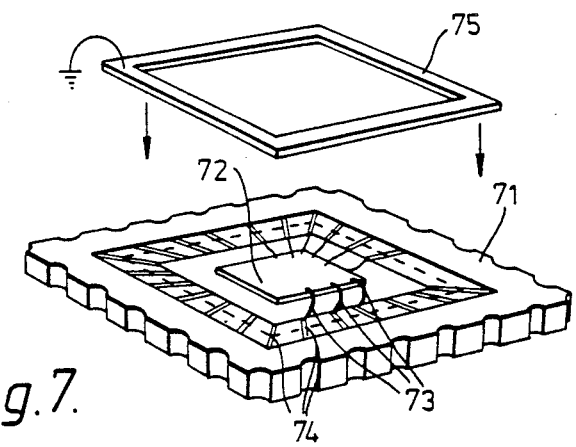
FIG. 7 is a perspective view of a chip carrier employing the device according to the invention.

FIG. 7 shows the use of a threshold circuit protection device according to the present invention on a chip carrier 71 containing a chip 72. The conductive I/O pads of chip 72 are wire bonded by wires 73 to conductive pads 74 in the chip carrier. The threshold circuit protection device 75 comprises a glass layer which contacts the conductive pads 74 of the chip carrier and an electrode layer in contact with the glass which can be grounded to earth through an appropriate earthpad in the chip carrier or any other appropriate point in the chip package. The threshold circuit protection device 75 covers a portion of the pad 74 of chip carrier 71 leaving a portion of each pad 74 available for wire bonding of the chip 72 and wires 73. The threshold circuit protection device 75 can be formed in situ on chip carrier 71 by first depositing the glass layer, for example by vapour deposition, on the appropriate areas of the conductive pads 74 of the chip carrier and then depositing the electrode layer on top of the glass, which in turn can be connected to earth through a separate wire bond to an earth pad or chip package frame. Alternatively the glass layer can be omitted from an appropriate pad on the chip carrier thereby permitting the electrode layer to be deposited on the glass and on and in contact with that pad which will serve as an earthing pad. The circuit protection device in the chip carrier allows all of the in/out circuits to be in contact with the glass layer which glass is in turn in contact with a ground plane. Thus any overvoltage which enters the package through any lead or I/O pad can immediately pass through the glass layer to the ground plane. As mentioned above, any appropriate elements such as the capacitor of FIGS. 4 or 5 may also be built into the combination of the circuit protection device and the chip carrier. The circuit protection device 75 can be connected to pads 74 by conductive adhesive or other appropriate means.

Figure 8:
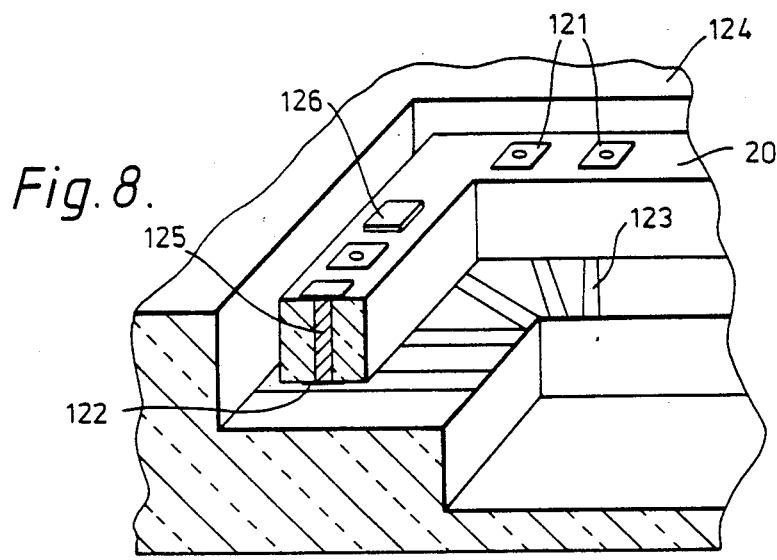
FIG. 8 is a view, partly in section, of a modification of the chip carrier of FIG. 7.
Figure 9:
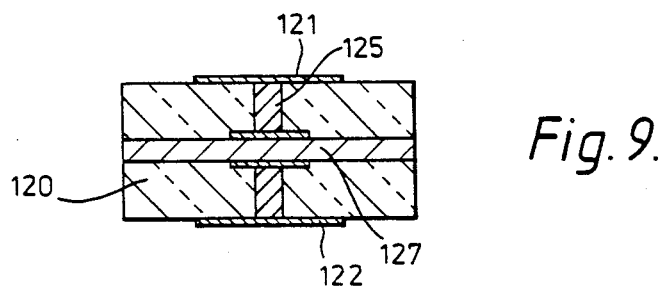
FIG. 9 is a section showing a further modification of the carrier shown in FIG. 7.

FIG. 8 shows a further modification of FIG. 7, here to frame 120 used to support the circuit protection device is multilayered. A pattern of electrodes 121, 122 is produced on both top an bottom faces of the frame to match electrodes 123 of the chip carrier 124. The two electrodes 121, 122 on opposite faces are interconnected by a conducting channel or via 125. A circuit protection device 126 is built up on the top electrode pattern 121 of the frame 120 and when completed the frame can be fitted into the chip carrier as shown in FIG. 10. As shown in FIG. 9, it is also possible to incorporate within the frame material the elements of a capacitor 127 within the structure of the via 125. This system of assembly provides for a more robust package since the circuit protection device is separated from the electrode tracks of the chip carrier by the conducting vias.

The following Examples illustrate the invention:

Samples of a number of chalcogenide glass compositions were prepared by mixing the components, which were of at least 99.99% purity, and melting the mixture in a silica ampoule under a vacuum or under reduced argon pressure. During melting, which was carried out at temperatures of up to 1000° C. and for periods of up to 48 hours depending on the composition, the ampoule was rocked and rotated in order to ensure that a homogeneous melt was obtained.

A 10 micrometer thick film of the glass so prepared was deposited onto a lower indium plated copper electrode by vapour deposition at a pressure of $10^{-3}$ to $10^{-4}$ Pa using either a resistance heated, or an electron beam heated, source. Deposition rates of 0.1 to 0.5 micrometers per minute were employed. An upper electrode of 1 mm$^2$ area was deposited by evaporating an indium layer followed by a copper layer in argon at a pressure of 10 Pa and at a deposition rate of 0.1 to 1 micrometers per minute.

The glasses had the compositions shown in Table I.

TABLE I

| | Components (parts by mole) | | | |
|---|---|---|---|---|
| Example | Ge | S | As | Te |
| 1 | | 60 | 40 | |
| 2 | 7 | 56 | 37 | |
| 3 | 14 | 52 | 34 | |
| 4 (comparison) | 14 | | 34 | 52 |
| 5 | 12 | 76 | 12 | |
| 6 (comparison) | 14 | 18 | 68 | |
| 7 | 4 | 50 | 46 | |
| 8 (comparison) | 49 | 32 | 17 | |
| 9 | 35 | 41 | 24 | |
| 10 | 20 | 61 | 19 | |
| 11 | 27 | 45 | 28 | |
| 12 | 19 | 24 | 57 | |
| 13 | 9 | 45 | 47 | |

The electrical properties of devices made from the glass compositions are shown in Table II.

TABLE II

| Example | Energy to Latch (mJ) | off resistance (M ohm) | Threshold Voltage (V) | Capacitance pF | Figure of Merit ($\times 10^{12}$ JA$^{-1}$F$^{-1}$) |
|---|---|---|---|---|---|
| 1 | 65 | 1 | 105 | 5 | 124 |
| 2 | 98 | 2 | 98 | 5.3 | 400 |
| 3 | 110 | 16 | 105 | 5.2 | 3352 |
| 4 (comparison) | 30 | 0.1 | 90 | 10.7 | 3.1 |
| 5 | 80 | 4.5 | 90 | 5 | 800 |
| 6 (comparison) | 12 | 0.01 | 105 | 6.1 | 0.23 |
| 7 | 230 | 1.5 | 90 | 5.7 | 767 |
| 8 (comparison) | 20 | 0.9 | 110 | 5.9 | 28 |
| 9 | 60 | 2.5 | 130 | 5.3 | 218 |
| 10 | 100 | 5.5 | 125 | 5.5 | 800 |
| 11 | 250 | 4.5 | 200 | 5.5 | 1023 |
| 12 | 60 | 2.2 | 120 | 5.7 | 193 |
| 13 | 80 | 2.5 | 100 | 5.8 | 345 |

Figure 6:
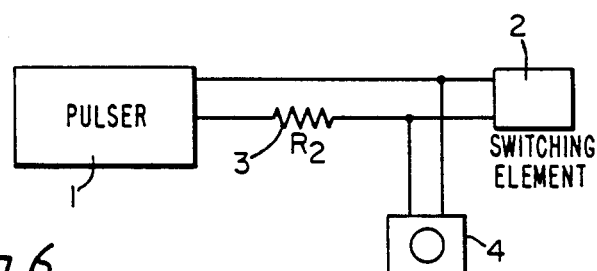
FIG. 6 is a diagram of a circuit used to determine the energy to latch of the materials and devices according to the invention.

The energy to latch of the device, and hence of the glass material, was measured by means of a circuit as shown in FIG. 6. Single shot pulses generated by means of a pulser 1 were passed to the switching element 2 connected in series with a current limiting resistor 3 having a resistance $R_2$ of from 40 to 100 ohms and the voltage across the switching element was observed by means of oscilloscopy 1. The voltage generated by the pulser 1 was gradually increased (about 5 to 10 pulses being passed for each voltage level from the pulser) until the switching element latached in its lower resistance state (determined by subsequently measuring its resistance.

The energy to latch the device, $E_L$ was determined by the equation:

$$E_L = J \cdot \frac{V^2}{(1000)} \cdot \frac{R_1}{(R_1 + R_2)}$$

where

J is the energy available from the pulser;

V is the peak voltage from the pulser when latching occurred;

$R_1$ is the internal output impedance of the pulser (5 ohms); and $R_2$ is the resistance of the current limiting resistor.

This equation gives very good agreement with values obtained by integrating the current and voltage curves of the pulses.

I claim:

1. A circuit protection device for protecting an electrical circuit from a voltage transient which comprises:
    a threshold switching element that will change from a high resistance state to a low resistance state on application of a voltage, but will remain in its low resistance state only for as long as a small holding current is maintained through the element, the switching element being formed from an amorphous composition comprising:
        (a) from 10 to 65 atomic percent arsenic;
        (b) from 15 to 90 atomic percent sulfur; and
    (c) up to 40 atomic percent germanium;
        in which the proportions of (a), (b) and (c) (based on the total molar quantity of (a), (b) and (c) add up to 100%
        the composition having not more than 10 atomic percent tellurium (based on the total molar quantity of the composition);
and a pair of electrodes in contact with the composition.

2. A device as claimed in claim 1, wherein the switching element is formed from a composition comprising:
    (a) from 3 to 30 atomic percent germanium;
    (b) from 10 to 65 atomic percent arsenic; and
    (c) from 30 to 80 atomic percent sulphur,
in which the proportions of (a), (b) and (c) based on the total quantity of (a), (b) and (c) add up to 100%.

3. A device as claimed in claim 2, wherein the switching element is formed from a composition comprising:
    (a) from 3 to 30 atomic percent germanium;
    (b) from 10 to 50 atomic percent arsenic; and
    (c) from 40 to 70 atomic percent sulphur.

4. A device as claimed in claim 1, which exhibits an energy to latch of at least 40 mJ.

5. A device as claimed in claim 1, which has an electrode-to-electrode resistance of not more than 1 ohm in its low resistance state.

6. A device as claimed in claim 1, wherein the composition contains indium and/or the switching element includes an interlayer comprising indium between the composition and at least one of the electrodes in order to reduce the electrical resistance of the device in its low resistance state.

7. An electrical circuit which comprises a circuit protection device comprising:
    (1) a threshold switching element that will change from a high resistance state to a low resistance state on application of a voltage, but will remain in its low resistance state only for as long as a small holding current is maintained through the element, the switching element being formed from an amorphous composition comprising:
        (a) from 10 to 65 anatomic percent arsenic;
        (b) from 15 to 90 amtomic percent sulfur; and
        (c) up to 42 atomic percent germanium; in which the proportions of (a), (b) and (c) (based on the total molar quantity of (a), (b) and (c)) add up to 100%;
    the composition having not more than 10 atomic percent tellurium (based on the total molar quantity of the composition); and
    (2) a pair of electrodes in contact with the composition;
the circuit protection device being electrically connected between a current carrying line of the circuit and earth.

* * * * *